(12) United States Patent
Cheng et al.

(10) Patent No.: US 9,263,584 B2
(45) Date of Patent: Feb. 16, 2016

(54) FIELD EFFECT TRANSISTORS EMPLOYING A THIN CHANNEL REGION ON A CRYSTALLINE INSULATOR STRUCTURE

(71) Applicant: International Business Machines Corporation, Armonk, NY (US)

(72) Inventors: Kangguo Cheng, Schenectady, NY (US); Bruce B. Doris, Slinerlands, NY (US); Pouya Hashemi, White Plains, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 14/177,313

(22) Filed: Feb. 11, 2014

(65) Prior Publication Data

US 2015/0228783 A1 Aug. 13, 2015

(51) Int. Cl.
| | |
|---|---|
| *H01L 27/12* | (2006.01) |
| *H01L 29/78* | (2006.01) |
| *H01L 29/66* | (2006.01) |
| *H01L 21/02* | (2006.01) |
| *H01L 21/311* | (2006.01) |

(52) U.S. Cl.
CPC ........ *H01L 29/785* (2013.01); *H01L 21/02192* (2013.01); *H01L 21/31111* (2013.01); *H01L 29/6681* (2013.01); *H01L 21/02488* (2013.01); *H01L 21/02639* (2013.01)

(58) Field of Classification Search
CPC ................... H01L 21/02178; H01L 21/02181; H01L 21/02183; H01L 21/02186; H01L 21/02189; H01L 21/02192; H01L 21/02488; H01L 21/02639; H01L 21/31111; H01L 29/785; H01L 29/6681
USPC .................... 257/437, E21.47, 347, 352, 353; 438/300, 96
See application file for complete search history.

(56) References Cited

U.S. PATENT DOCUMENTS

| | | | | |
|---|---|---|---|---|
| 5,296,727 | A | * | 3/1994 | Kawai et al. .................. 257/260 |
| 7,358,122 | B2 | | 4/2008 | Chu |
| 7,417,288 | B2 | | 8/2008 | Dennard et al. |
| 7,635,634 | B2 | | 12/2009 | Stapelmann et al. |
| 7,678,658 | B2 | | 3/2010 | Yang et al. |

(Continued)

FOREIGN PATENT DOCUMENTS

CN 102437042 A 5/2012

*Primary Examiner* — Jasmine Clark
(74) *Attorney, Agent, or Firm* — Scully, Scott, Murphy & Presser, P.C.; Louis J. Percello, Esq.

(57) ABSTRACT

A single crystalline dielectric layer is provided on an insulator layer including an amorphous dielectric material. The single crystalline dielectric layer can be patterned into various crystalline dielectric portions including dielectric fins, dielectric nanowires, and a dielectric fin-plate assembly. A semiconductor material can be deposited on the single crystalline surfaces of the various crystalline dielectric portions by a selective epitaxial deposition process while not growing on the surfaces of the insulator layer. Single crystalline semiconductor material portions can be formed on the surfaces of the dielectric fins, around the dielectric nanowires, and on horizontal and vertical surfaces of the dielectric fin-plate assembly. Source and drain regions can be formed in the single crystalline semiconductor material portions, and gate electrodes can be formed to provide various field effect transistors.

20 Claims, 10 Drawing Sheets

(56) References Cited

U.S. PATENT DOCUMENTS

| | | |
|---|---|---|
| 8,314,475 B2 | 11/2012 | Ribeiro et al. |
| 2005/0152094 A1* | 7/2005 | Jeong et al. .................. 361/312 |
| 2010/0301420 A1 | 12/2010 | Merckling et al. |
| 2012/0138886 A1 | 6/2012 | Kuhn et al. |

* cited by examiner

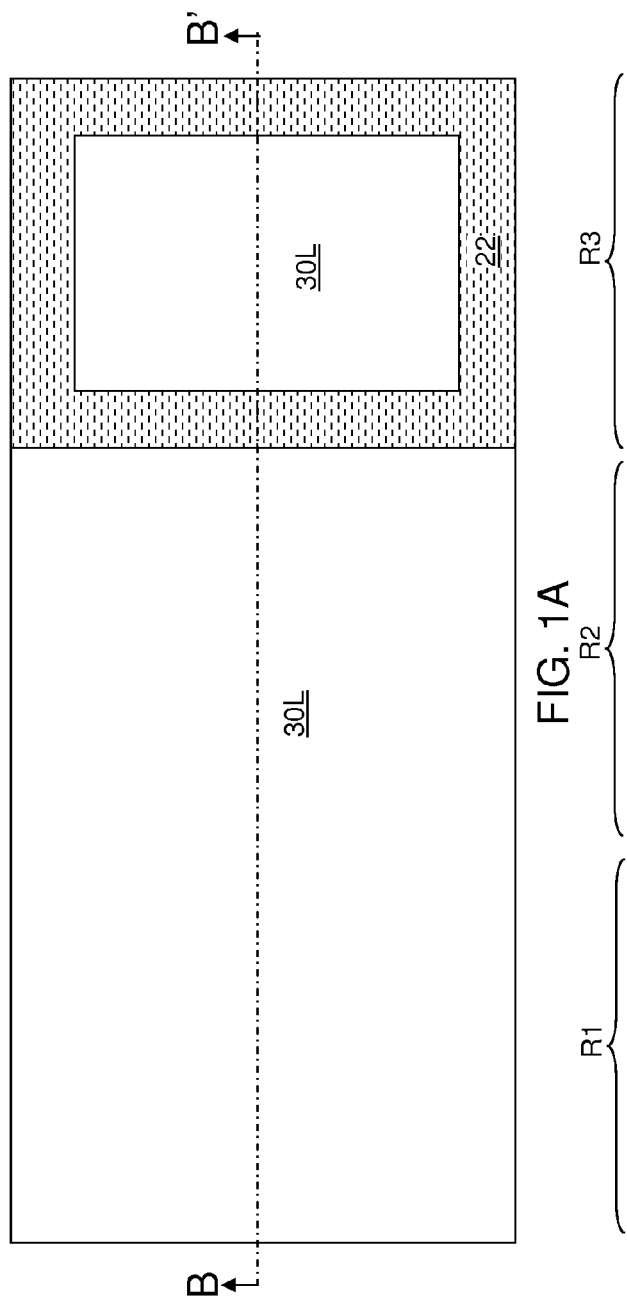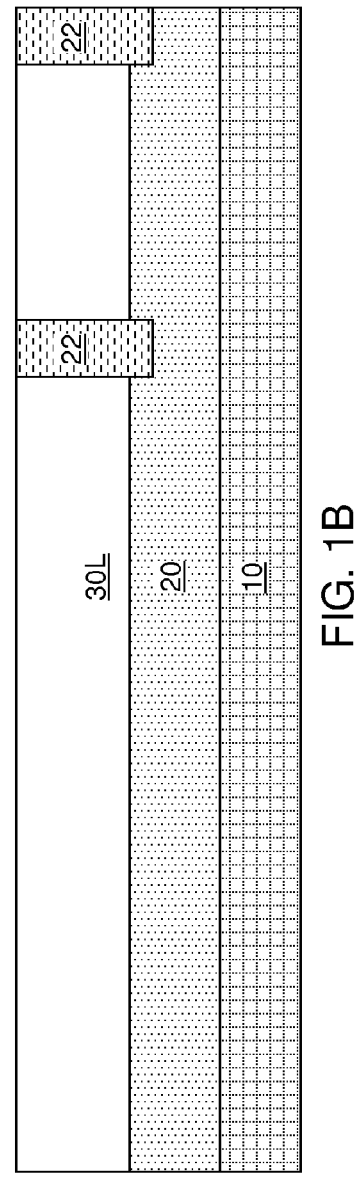

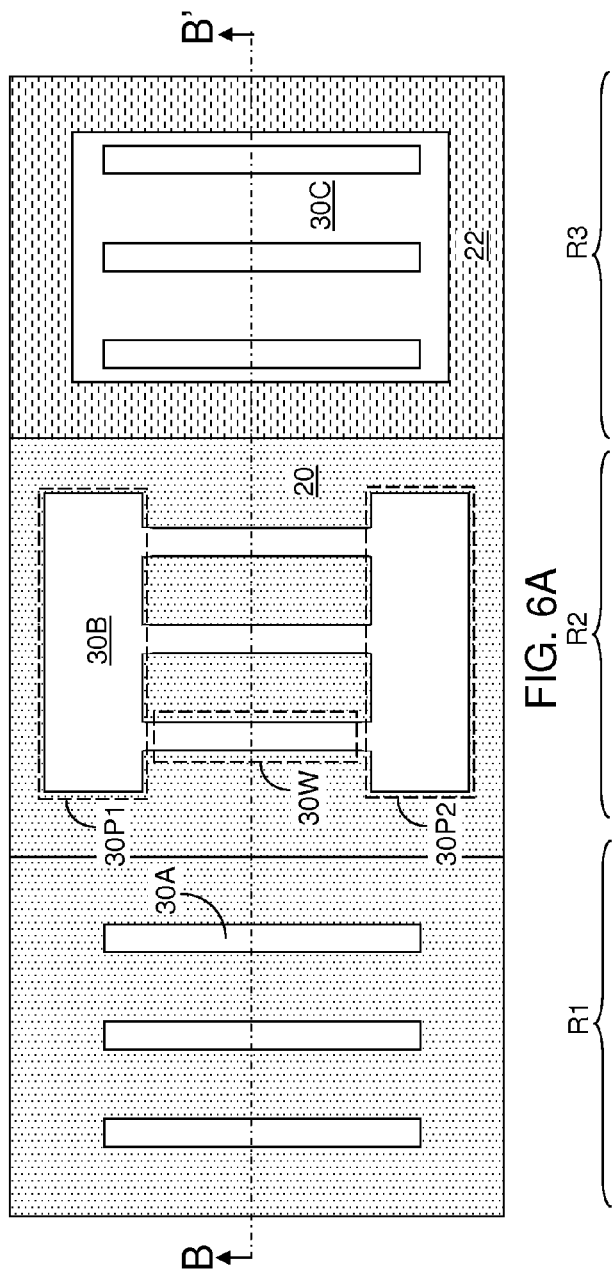
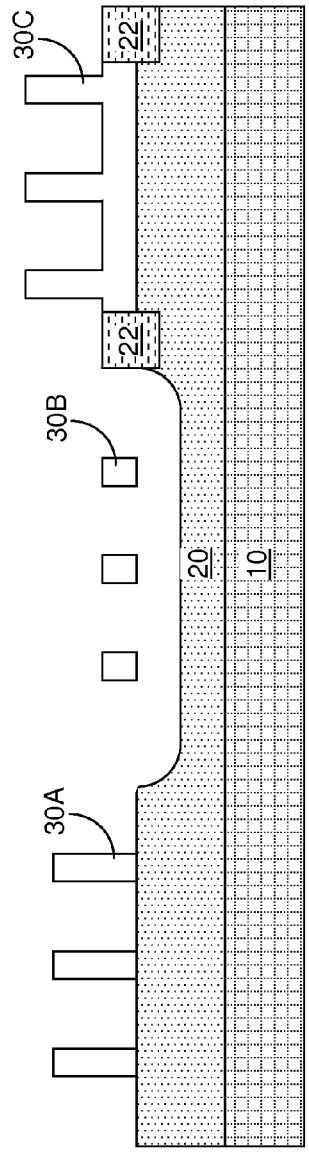
FIG. 6A
FIG. 6B

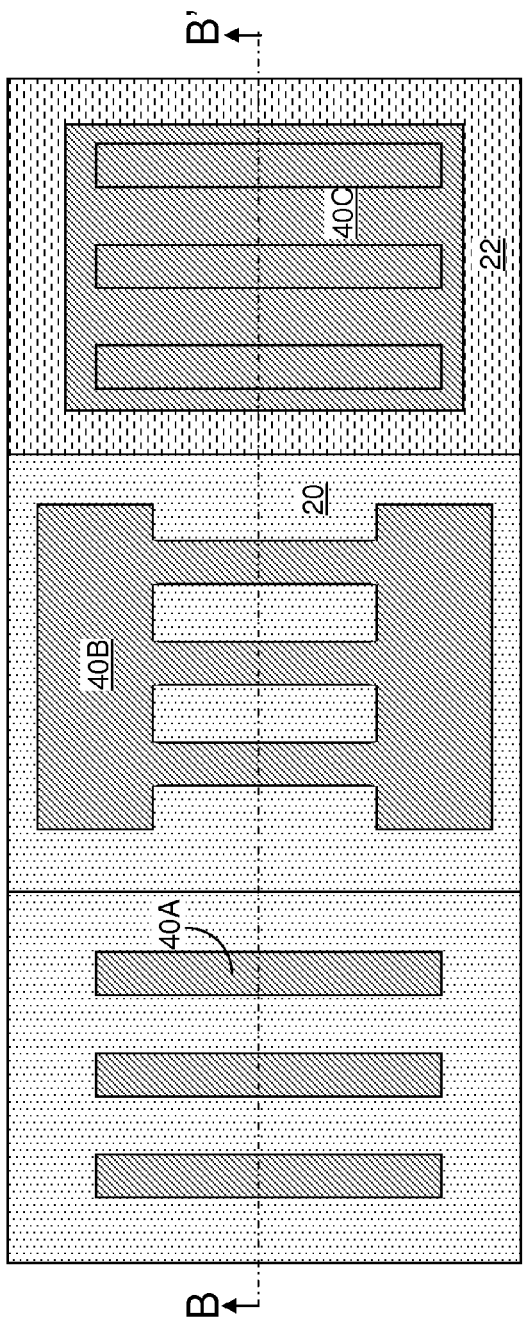
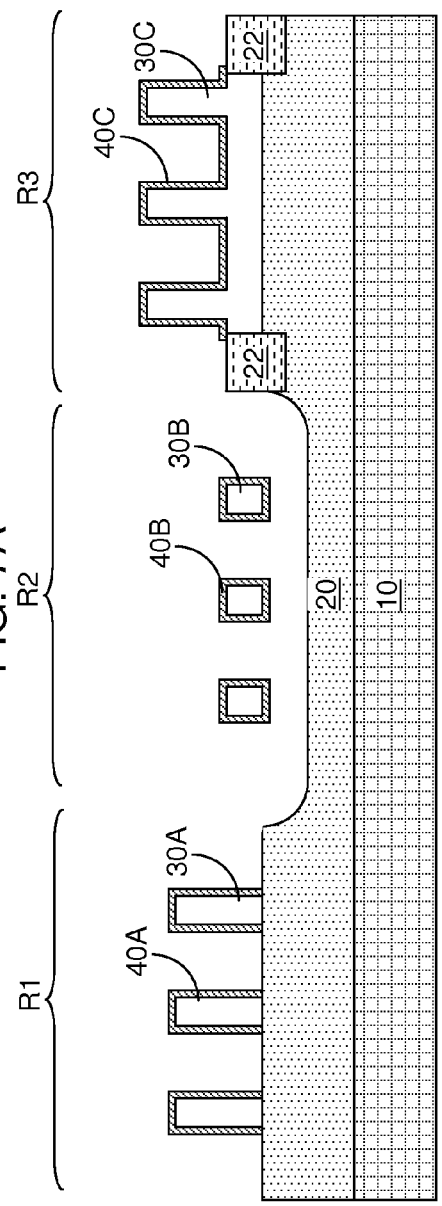
FIG. 7A
FIG. 7B

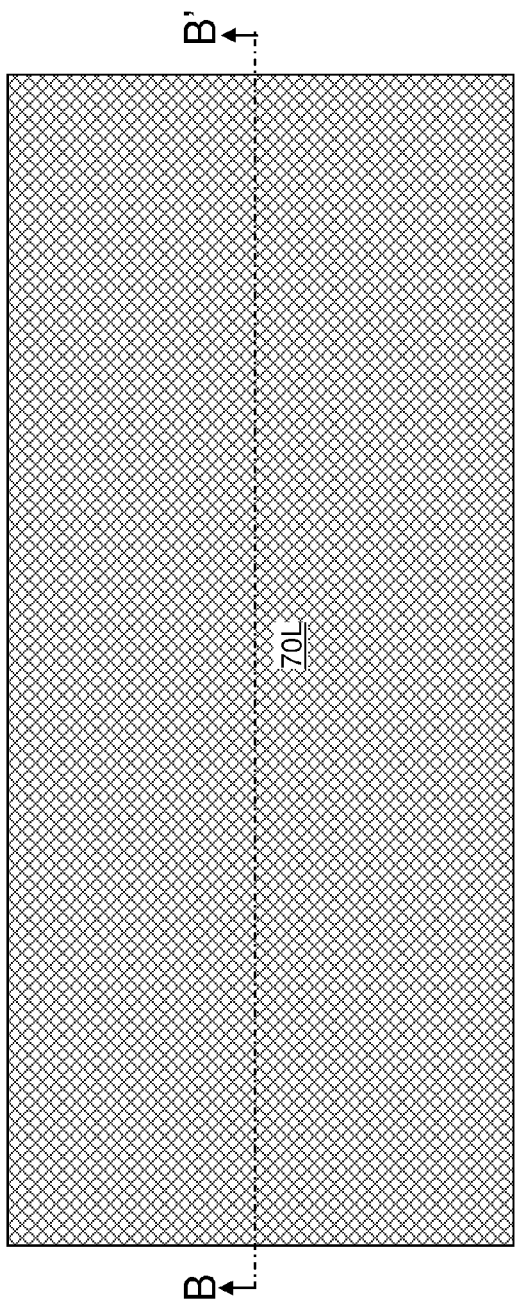
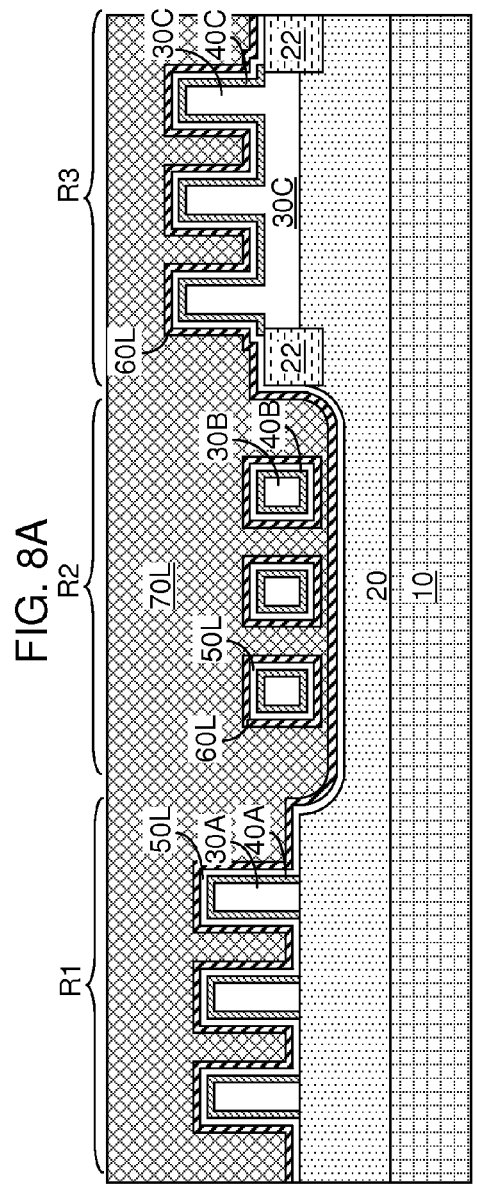
FIG. 8A
FIG. 8B

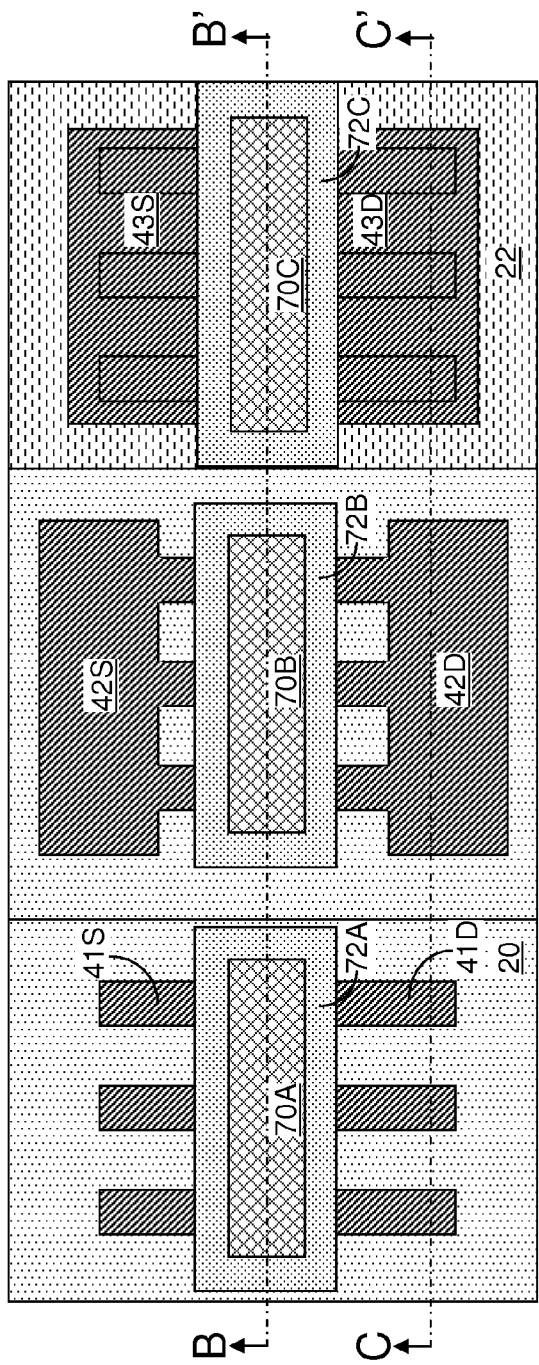
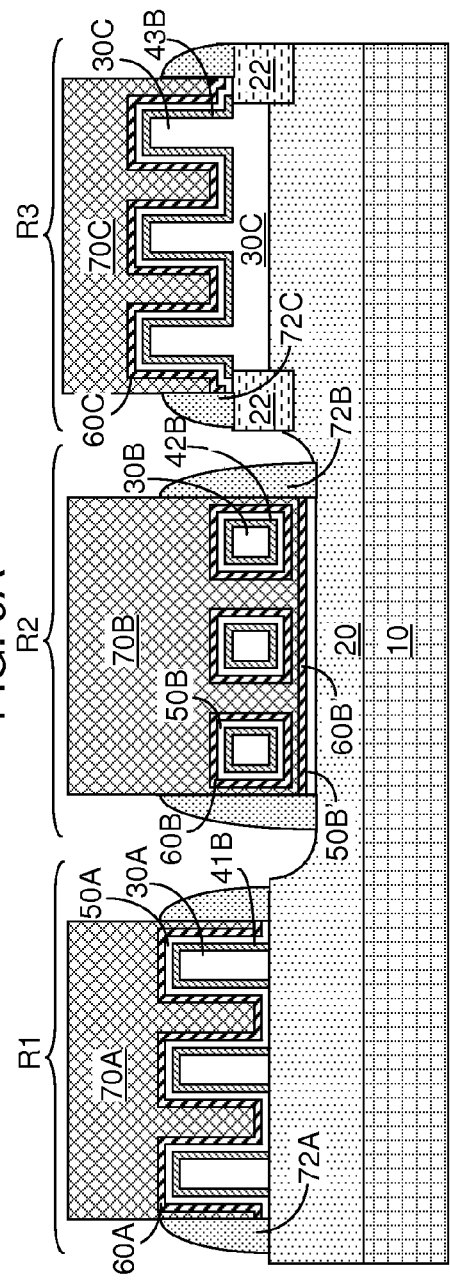
FIG. 9A
FIG. 9B

FIELD EFFECT TRANSISTORS EMPLOYING A THIN CHANNEL REGION ON A CRYSTALLINE INSULATOR STRUCTURE

BACKGROUND

The present disclosure relates to a semiconductor structure, and particularly to field effect transistors including a channel region formed on a crystalline insulator structure and a method of manufacturing the same.

The degree of control of electronic transport in the channel region of a field effect transistor depends on the thickness of the channel region. In general, the thicker the channel region, the more difficult it is to control the electronic transport of charge carriers in the channel region.

Formation of thin fins, however, poses a challenge in semiconductor manufacturing because of inherent structural weakness in thin structures. The problem of manufacturing thin channel regions becomes even more challenging when multiple types of field effect transistors need to be provided. For example, a combination of fin filed effect transistors and semiconductor nanowire field effect transistors may be desirable to provide a variety of field effect transistors for various applications in a semiconductor chip. For this reason, a method is desired for forming field effect transistors having thin channel regions without structural instability of fragility issues.

SUMMARY

A single crystalline dielectric layer is provided on an insulator layer including an amorphous dielectric material. The single crystalline dielectric layer can be patterned into various crystalline dielectric portions including dielectric fins, dielectric nanowires, and a dielectric fin-plate assembly. A semiconductor material can be deposited on the single crystalline surfaces of the various crystalline dielectric portions by a selective epitaxial deposition process while not growing on the surfaces of the insulator layer. Single crystalline semiconductor material portions can be formed on the surfaces of the dielectric fins, around the dielectric nanowires, and on horizontal and vertical surfaces of the dielectric fin-plate assembly. Source and drain regions can be formed in the single crystalline semiconductor material portions, and gate electrodes can be formed to provide various field effect transistors.

According to an aspect of the present disclosure, a semiconductor structure includes an amorphous dielectric layer, a single crystalline dielectric material fin located on a portion of a top surface of the amorphous dielectric layer, a single crystalline semiconductor material layer, and a gate structure including a gate dielectric and a gate electrode and straddling the single crystalline semiconductor material layer. The single crystalline semiconductor material layer is in epitaxial alignment with the single crystalline dielectric material fin and contacts sidewall surfaces and a top surface of the single crystalline dielectric material fin.

According to another aspect of the present disclosure, a method of forming a semiconductor structure is provided. A substrate is provided, which includes at least a vertical stack of an amorphous dielectric layer and a single crystalline dielectric material layer. The single crystalline dielectric material layer is patterned to form at least a single crystalline dielectric material fin. A single crystalline semiconductor material layer is formed directly on sidewall surfaces and a top surface of the single crystalline dielectric material fin by selective epitaxy of a semiconductor material. A gate structure including a gate dielectric and a gate electrode is formed across the single crystalline semiconductor material layer.

BRIEF DESCRIPTION OF SEVERAL VIEWS OF THE DRAWINGS

FIG. 1A is a top-down view of an exemplary structure after formation of a shallow trench isolation structure through a single crystalline dielectric material layer onto an amorphous dielectric layer according to an embodiment of the present disclosure.

FIG. 1B is a vertical cross-sectional view of the exemplary structure along the vertical plane B-B' of FIG. 1A.

FIG. 6A is a top-down view of the exemplary structure after removal of a photoresist layer according to an embodiment of the present disclosure.

FIG. 6B is a vertical cross-sectional view of the first exemplary structure along the vertical plane B-B' of FIG. 6A.

FIG. 7A is a top-down view of the exemplary structure after formation of various single crystalline semiconductor layers according to an embodiment of the present disclosure.

FIG. 7B is a vertical cross-sectional view of the exemplary structure along the vertical plane B-B' of FIG. 7A.

FIG. 8A is a top-down view of the exemplary structure after formation of a gate dielectric layer and various gate conductor layers according to an embodiment of the present disclosure.

FIG. 8B is a vertical cross-sectional view of the second exemplary structure along the vertical plane B-B' of FIG. 8A.

FIG. 9A is a top-down view of the exemplary structure after formation of gate structures and gate spacers according to an embodiment of the present disclosure.

FIG. 9B is a vertical cross-sectional view of the exemplary structure along the vertical plane B-B' of FIG. 9A.

DETAILED DESCRIPTION

Figure 2A:
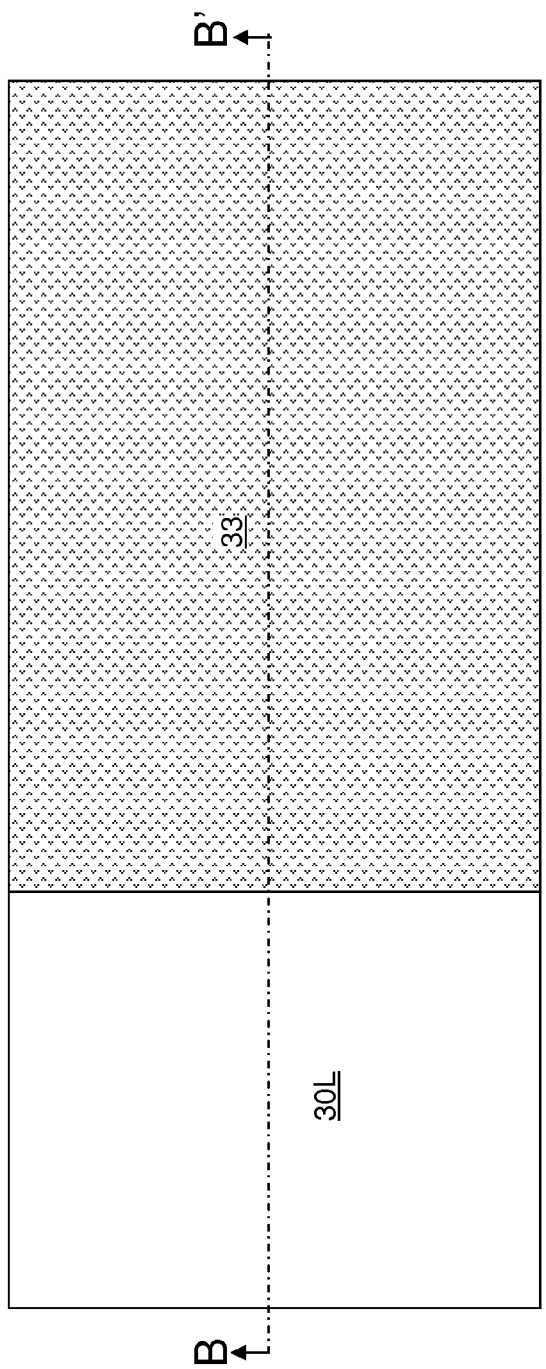
FIG. 2A is a top-down view of the exemplary structure after recessing a portion of the single crystalline dielectric material layer according to an embodiment of the present disclosure.

As stated above, the present disclosure relates to field effect transistors including a channel region formed on a crystalline insulator structure and a method of manufacturing the same. Aspects of the present disclosure are now described in detail with accompanying figures. It is noted that like reference numerals refer to like elements across different embodiments.

The drawings are not necessarily drawn to scale. As used herein, ordinals such as "first" and "second" are employed merely to distinguish similar elements, and different ordinals may be employed to designate a same element in the specification and/or claims.

Referring to FIGS. 1A and 1B, an exemplary structure according to an embodiment of the present disclosure includes a substrate (10, 20, 30L), which includes at least a vertical stack of an amorphous dielectric layer 20 and a single crystalline dielectric material layer 30L. The substrate (10, 20, 30L) can further include a handle substrate 10.

The handle substrate 10 can include a semiconductor material, a conductive material, and/or a dielectric material. The handle substrate 10 can provide mechanical support to the amorphous dielectric layer 20 and the single crystalline dielectric material layer 30L. The thickness of the handle substrate 10 can be from 30 microns to 2 mm, although lesser and greater thicknesses can also be employed.

The amorphous dielectric layer 20 includes an amorphous dielectric material. The amorphous dielectric material is amorphous and has a resistivity greater than $3 \times 10^3$ Ohm-cm. The amorphous dielectric layer 20 can include a dielectric material such as silicon oxide, silicon nitride, silicon oxynitride, sapphire, or a combination thereof. The thickness of the buried amorphous dielectric layer 20 can be from 50 nm to 5 microns, although lesser and greater thicknesses can also be employed. In one embodiment, the amorphous dielectric layer 20 and the handle substrate 10 can be a single contiguous structure including a same insulator material, i.e., the handle substrate 10 and the amorphous dielectric layer 20 can be merged into a single insulating layer including a same insulating material.

The single crystalline dielectric material layer 30L includes a single crystalline dielectric material. In one embodiment, the single crystalline dielectric material layer 30L can include a rare-earth oxide material, i.e., an oxide material of a rare-earth element. Rare earth elements are also referred to as Lanthanides, and include La, Ce, Pr, Nd, Pm, Sm, Eu, Gd, Tb, Dy, Ho, Er, Tm, Yb, and Lu. The ionic radii of rare earth elements decrease gradually with the atomic number, and the total variation of the ionic radii of rare earth elements is less than 15% among one another. The rare earth elements form various single crystalline dielectric oxides with a valance of +3, i.e., a dielectric oxide having a chemical formula of $M_2O_3$, in which M can be any of the rare earth elements.

Crystalline rare earth oxides are lattice coincident on a class of elemental or alloyed single crystalline semiconductor materials including single crystalline silicon, a single crystalline silicon-germanium alloy, a single crystalline silicon-carbon alloy, and a single crystalline silicon-germanium-carbon alloy. As used herein, a first material is lattice coincident with a second material if the lattice constant of the first material is a multiple with the lattice constant of the second material. For each single crystalline $M_2O_3$ in which M is a rare earth element, at least one single crystalline semiconductor material having a lattice constant that is one half the lattice constant of the single crystalline $M_2O_3$ exists among single crystalline silicon, a single crystalline silicon-germanium alloy, a single crystalline silicon-carbon alloy, and a single crystalline silicon-germanium-carbon alloy.

For example, twice the lattice constant of silicon is between the lattice constant of gadolinium oxide ($Gd_2O_3$) and the lattice constant of neodymium oxide ($Nd_2O_3$). Thus, the composition of a single crystalline alloy of gadolinium oxide and neodymium oxide can be selected to match twice the lattice constant of silicon. In other words, the value x in the compound $Gd_{2-x}Nd_xO_3$ can be selected to provide a single crystalline compound having a lattice constant that is twice the lattice constant of silicon.

In another example, twice the lattice constant of germanium is between the lattice constant of praseodymium oxide ($Pd_2O_3$) and the lattice constant of lanthanum oxide ($La_2O_3$). Thus, the composition of a single crystalline alloy of praseodymium oxide and lanthanum oxide can be selected to match twice the lattice constant of germanium. In other words, the value y in the compound $Pd_{2-y}La_yO_3$ can be selected to provide a single crystalline compound having a lattice constant that is twice the lattice constant of silicon.

In a non-limiting exemplary embodiment, single crystalline dielectric material layer 30L can include a single crystalline rare earth oxide selected from $Er_2O_3$, $Gd_2O_3$, $Nd_2O_3$, $Pr_2O_3$, $La_2O_3$, and a single crystalline alloy thereof.

In addition, crystalline rare earth oxides are lattice coincident on various single crystalline semiconductor materials that include III-V compound semiconductor materials and II-VI compound semiconductor materials. Thus, for each single crystalline $M_2O_3$ in which M is a rare earth element, at least one single crystalline compound semiconductor material having a lattice constant that is one half the lattice constant of the single crystalline $M_2O_3$ exists.

By selecting a rare-earth oxide material that is an oxide of a single rare-earth element or an oxide of an alloy of at least two rare-earth elements, the single crystalline dielectric material layer 30L can be lattice matched to a single crystalline semiconductor material. Method of forming a single crystalline rare-earth oxide material is described, for example, in U.S. Pat. Nos. 7,655,327 and 7,709,826 to Atanackovic.

The substrate (10, 20, 30L) can be formed by providing a first substrate including a stack of the handle substrate 10 and the amorphous dielectric layer 20 and a second substrate including the single crystalline dielectric material layer 30L on a single crystalline semiconductor substrate, and bonding the crystalline dielectric material layer 30L to the amorphous dielectric layer 20. The single crystalline semiconductor substrate can be subsequently removed by cleaving and/or polishing. The substrate (10, 20, 30L) including the handle substrate 10, the amorphous dielectric layer 20, and the single crystalline dielectric material layer 30L can thus be provided.

A shallow isolation trench can be formed through the single crystalline dielectric material layer 30L employing an etch process after formation of a patterned masking layer (not shown), which can be a patterned photoresist layer or a patterned hard mask layer. The shallow isolation trench can be filled with another amorphous dielectric material to form a shallow trench isolation structure 22. Excess portions of the amorphous dielectric material are removed from above the top surface of the single crystalline dielectric material layer 30L. The amorphous dielectric of the shallow trench isolation structure 22 can be the same as, or different from, the amorphous dielectric material of the amorphous dielectric layer 20. The shallow trench isolation structure 22 can include, for example, silicon oxide, silicon nitride, silicon oxynitride, sapphire, or a combination thereof. The patterned masking layer is removed prior to, or after, deposition of the amorphous dielectric material of the shallow trench isolation structure 22.

The exemplary structure can include various device regions. For example, the various device regions can include a first device region R1 in which a fin field effect transistor is subsequently formed, a second device region R2 in which a nanowire field effect transistor is subsequently formed, and a third device region R3 in which a field effect transistor is formed on a fin-plate assembly. In one embodiment, the shallow trench isolation structure 22 can be formed in the third device region R3.

Figure 2B:
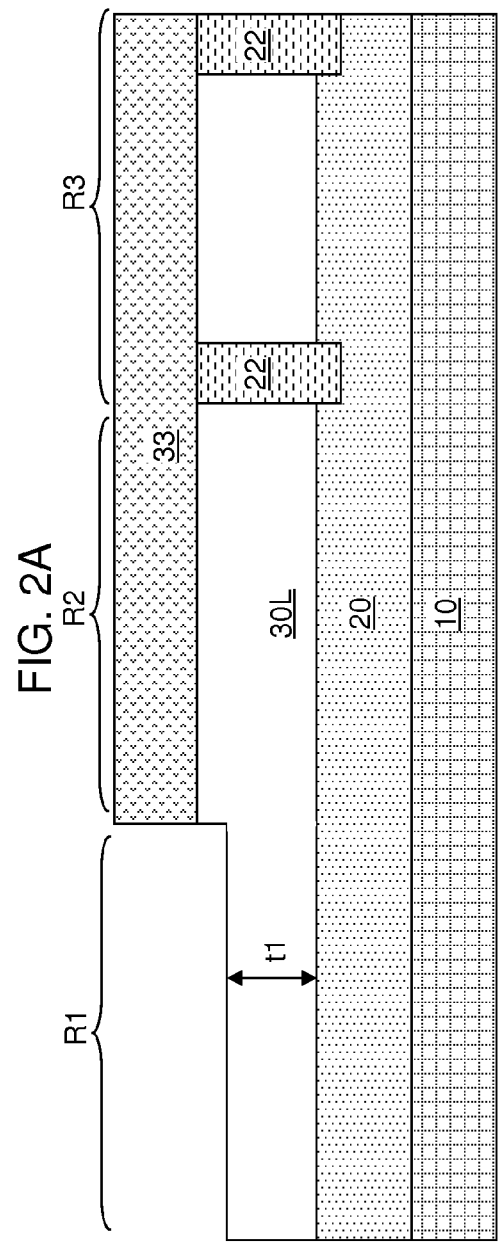
FIG. 2B is a vertical cross-sectional view of the exemplary structure along the vertical plane B-B' of FIG. 2A.

Referring to FIGS. 2A and 2B, a first mask layer 33 can be formed over the single crystalline dielectric material layer 30L and patterned to cover the second device region R2 and the third device region R3. The first mask layer 33 can be a lithographically patterned photoresist layer, or can be a dielectric material layer that is patterned employing a photoresist layer (not shown). If a dielectric material layer is employed for the first mask layer 33, the dielectric material layer can include, for example, silicon oxide or silicon nitride.

A physically exposed portion of the top surface of the single crystalline dielectric layer 30L is recessed in the first device region R1 by a first recess etch process that employs the first mask layer 33 as an etch mask. The first recess etch process can be an isotropic etch process such as a wet etch process, or can be an anisotropic etch process such as a reactive ion etch process. The first device region R1 of the single crystalline dielectric material layer 30L is thinned, while the second and third device regions (R2, R3) of the single crystalline dielectric material layer 30L are masked during the first recess etch process. The thickness of the single crystalline dielectric layer 30L within the first device region R1 after the first recess etch process is herein referred to as a first thickness t1, which is less than the original thickness of the single crystalline dielectric layer 30L as provided at the processing step of FIGS. 1A and 1B. The first mask layer 33 can be subsequently removed, for example, by ashing or by a wet etch.

Figure 3A:
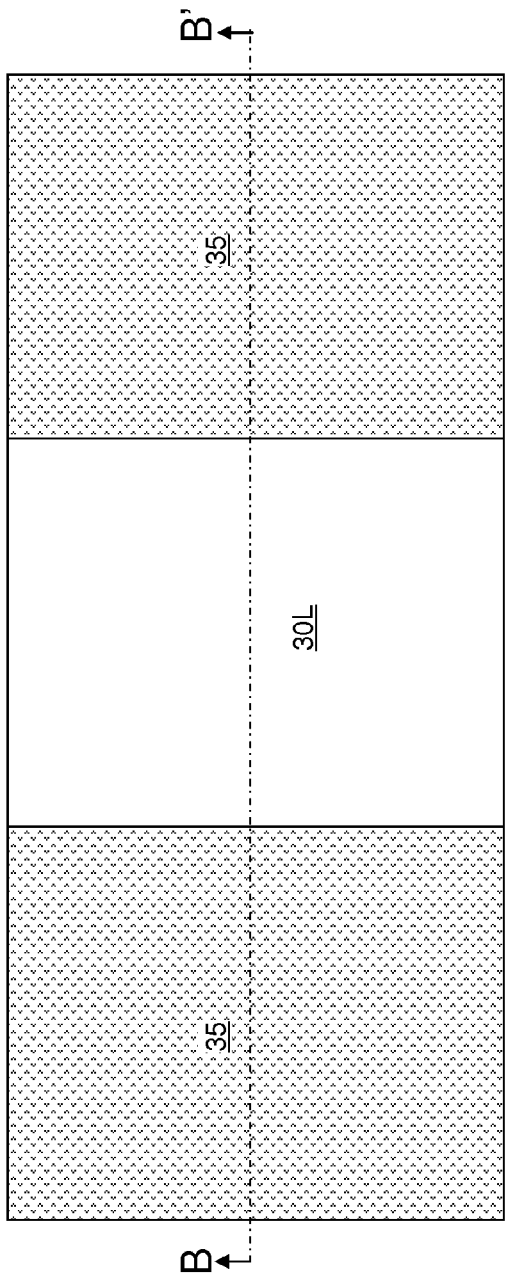
FIG. 3A is a top-down view of the exemplary structure after recessing another portion of the single crystalline dielectric material layer according to an embodiment of the present disclosure.
Figure 3B:
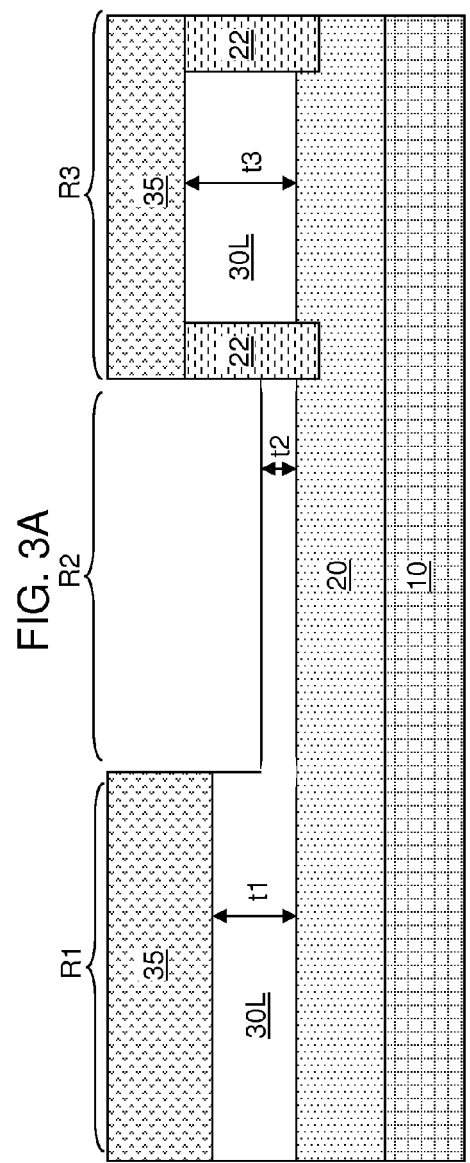
FIG. 3B is a vertical cross-sectional view of the exemplary structure along the vertical plane B-B' of FIG. 3A.

Referring to FIGS. 3A and 3B, a second mask layer 35 can be formed over the single crystalline dielectric material layer 30L and patterned to cover the first device region R1 and the third device region R3. The second mask layer 35 can be a lithographically patterned photoresist layer, or can be a dielectric material layer that is patterned employing a photoresist layer (not shown). If a dielectric material layer is employed for the second mask layer 35, the dielectric material layer can include, for example, silicon oxide or silicon nitride.

A physically exposed portion of the top surface of the single crystalline dielectric layer 30L is recessed in the second device region R2 by a second recess etch process that employs the second mask layer 35 as an etch mask. The second recess etch process can be an isotropic etch process such as a wet etch process, or can be an anisotropic etch process such as a reactive ion etch process. The second device region R2 of the single crystalline dielectric material layer 30L is thinned, while the first and third device regions (R1, R3) of the single crystalline dielectric material layer 30L are masked during the second recess etch process. The thickness of the single crystalline dielectric layer 30L within the second device region R2 after the second recess etch process is herein referred to as a second thickness t2, which is less than the original thickness of the single crystalline dielectric layer 30L as provided at the processing step of FIGS. 1A and 1B. The second thickness t2 can be less than the first thickness t1. The second mask layer 35 can be subsequently removed, for example, by ashing or by a wet etch. The thickness of the single crystalline dielectric layer 30L in the third device region R3 is herein referred to as a third thickness t3.

Figure 4A:
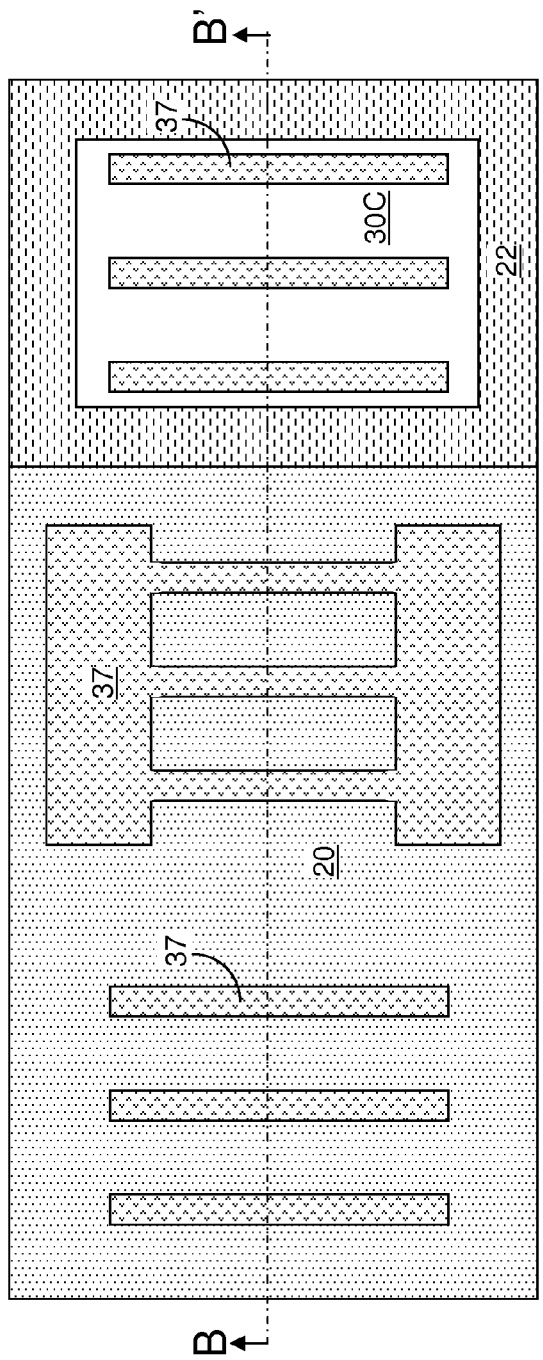
FIG. 4A is a top-down view of the exemplary structure after patterning the single crystalline dielectric material layer according to an embodiment of the present disclosure.
Figure 4B:
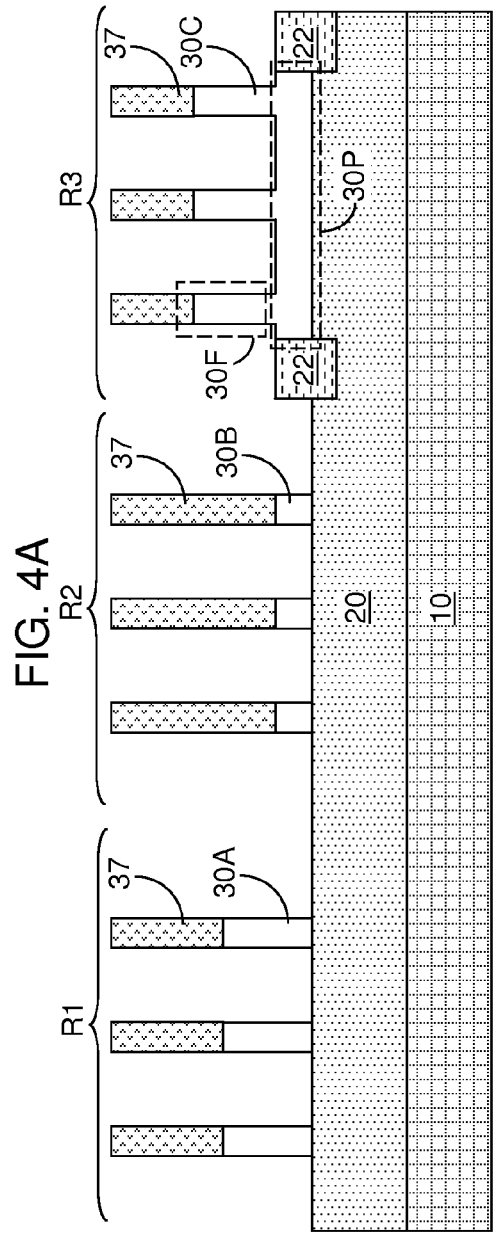
FIG. 4B is a vertical cross-sectional view of the exemplary structure along the vertical plane B-B' of FIG. 4A.

Referring to FIGS. 4A and 4B, a photoresist layer 37 is applied over the single crystalline dielectric layer 30L, and is lithographically patterned to define various shapes for semiconductor devices to be subsequently formed. The pattern in the photoresist layer 37 is transferred into the single crystalline dielectric layer 30L by an anisotropic etch such as a reactive ion etch to concurrently pattern the single crystalline dielectric layer 30L in the various device regions (R1, R2, R3). Various single crystalline dielectric material structures (30A, 30B, 30C) are formed over the amorphous dielectric layer 20 by the patterning of the single crystalline dielectric layer 30L.

In one embodiment, the photoresist layer 30 can include elongated rectangular shapes within the first and third device region (R1, R3) and an integral shape including at elongated rectangular shape laterally adjoined to a pair of rectangular pad shapes. The duration of the anisotropic etch that transfers the pattern in the photoresist layer 30L can be selected such that the anisotropic etch can remove the material of the single crystalline dielectric layer 30L by more than the first thickness t2 and less than the third thickness t3. A planar portion of the single crystalline dielectric layer 30L having a uniform thickness can be formed within the third device region R3. Thus, at least one single crystalline dielectric fin 30A can be formed in the first device region, a single crystalline dielectric material portion 30B can be formed within the second device region R2, and a fin-plate assembly 30C including a plate portion 30P can be formed within the third device region R3.

As used herein, a "fin" refers to a structure including a parallel pair of vertical sidewalls and a parallel pair of a top surface and a bottom surface. The height of a fin can be greater than the width of the fin. In one embodiment, a fin can be a rectangular prism. As used herein, a "dielectric material fin" refers to a fin composed a dielectric material. As used herein, a "single crystalline dielectric material fin" refers to a fin composed of a single crystalline dielectric material. In one embodiment, the single crystalline dielectric material fins 30A of the present disclosure can include a single crystalline rare earth oxide material having the same set of crystallographic orientations throughout.

The single crystalline dielectric material portion 30B formed within the second device region R2 includes at least one single crystalline dielectric nanowire and a pair of single crystalline dielectric pads adjoined to each of the at least one single crystalline dielectric nanowire. As used herein, a "nanowire" refers to a structure that extends along a lengthwise direction and having dimensions in a range from 1 nm to 100 nm in all directions perpendicular to the lengthwise direction. As used herein, a "dielectric nanowire" refers to a nanowire composed of a dielectric material. As used herein, a "single crystalline dielectric nanowire" refers to a nanowire composed of a single crystalline dielectric material. As used herein, a "lengthwise" direction of an element is the direction along which the moment of rotation is minimized. In one embodiment, each of the at least one single crystalline dielectric nanowire can be a rectangular prism, i.e., a rectangular parallelepiped.

The fin-plate assembly 30C formed within the third device region R2 includes a plate portion 30P contacting a portion of the top surface of the amorphous dielectric layer 20 and at least one fin portion 30F protruding from the plate portion 30P. Each of the at least one fin portion 30F is a single crystalline dielectric fin. Thus, each of the at least one fin portion 30F has a pair of parallel sidewalls extending along a lengthwise direction. The bottom surface of the plate portion 30P is coplanar with the top surface of the amorphous dielectric layer 20. The fin-plate assembly 30C can include a plurality of fin portions 30F that protrude from the plate portion 30P. The plurality of fin portions 30F can be laterally spaced from one another.

Subsequently, the photoresist layer 37 can be removed, for example, by ashing.

Figure 5A:
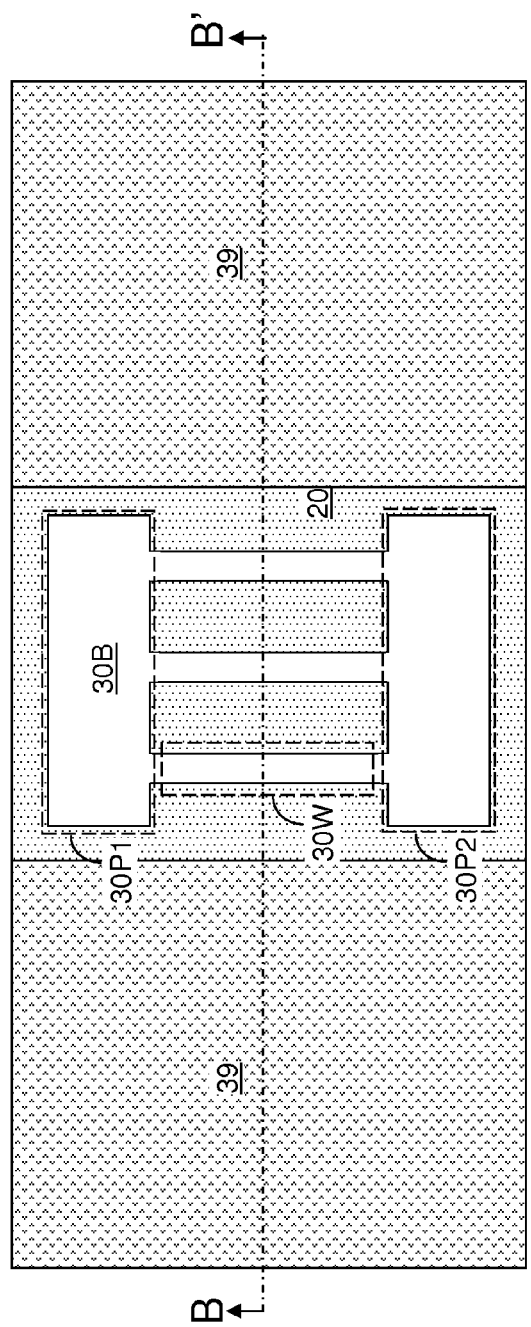
FIG. 5A is a top-down view of the exemplary structure after undercutting portions of the single crystalline dielectric layer from underneath single crystalline nanowires employing an isotropic etch according to an embodiment of the present disclosure.
Figure 5B:
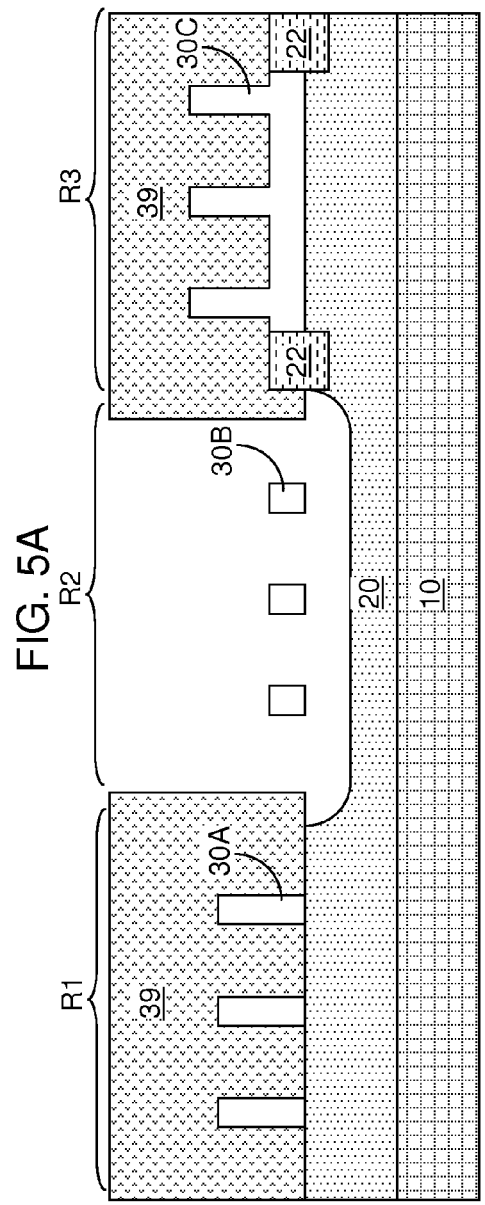
FIG. 5B is a vertical cross-sectional view of the first exemplary structure along the vertical plane B-B' of FIG. 5A.

Referring to FIGS. 5A and 5B, another photoresist layer 39 is applied over the various single crystalline dielectric material structures (30A, 30B, 30C), and is lithographically patterned to cover the first device region R1 and the third device region R3, while physically exposing the top surface and the sidewall surfaces of the single crystalline dielectric material portion 30B. An isotropic etch is performed to undercut the single crystalline dielectric material portion 30B (which is a remaining portion of the single crystalline dielectric layer 30L (See FIGS. 1A and 1B)) from underneath single crystalline nanowires. Portion of the top surface of the amorphous dielectric layer 20 is recessed from underneath the at least one single crystalline dielectric nanowire in an isotropic etch process. The at least one single crystalline dielectric nanowire becomes suspended over a recessed surface of the amorphous dielectric layer 20.

The single crystalline dielectric material portion 30B located on the amorphous dielectric layer 20 includes at least one single crystalline dielectric nanowire 30W, a first single crystalline dielectric pad 30P1 adjoined to one end of each of the at least one single crystalline dielectric nanowire 30W, and a second single crystalline dielectric pad 30P2 adjoined to another end of each of the at least one single crystalline dielectric nanowire 30W.

Each of the first and second single crystalline dielectric pads (30P1, 30P2) contacts a portion of the top surface of the amorphous dielectric layer 20 that is coplanar with the portions of the top surface of the amorphous dielectric layer 20 that contact bottom surfaces of the at least one single crystalline dielectric material fins 30A and the fin-plate assembly 30C. The at least one single crystalline dielectric nanowire 30W is located above the recessed surface of the amorphous dielectric layer 20. The bottom surface of each of the at least one single crystalline dielectric nanowire 30W is coplanar with the bottom surface of each single crystalline dielectric material fin 30A. A pair of pedestal portions of the single crystalline dielectric material layer 20 is in contact with center portions of bottom surfaces of the pair of single crystalline dielectric pads (30P1, 30P2) after the isotropic etch process.

Referring to FIGS. 6A and 6B, the photoresist layer 39 can be removed, for example, by ashing.

Referring to FIGS. 7A and 7B, various single crystalline semiconductor layers (40A, 40B, 40C) are formed on the physically exposed surfaces of the various single crystalline dielectric material structures (30A, 30B, 30C) by selective epitaxy of a semiconductor material. The semiconductor material is selected such that the lattice constant of the single crystalline dielectric material is substantially lattice commensurate with the lattice constant of the semiconductor material. As used herein, a first material is "substantially lattice commensurate" with a second material if the mismatch between the lattice constant of the first material and a parameter selected from the lattice constant of the second material, twice the lattice constant of the second material, thrice the lattice constant of the second material, and four times the lattice constant of the second material is within 10% of each other. In one embodiment, the semiconductor material can be selected such that the lattice constant of the material of the various single crystalline dielectric material structures (30A, 30B, 30C) is within 10% of twice the lattice constant of the semiconductor material deposited by selective epitaxy.

The various single crystalline semiconductor layers (40A, 40B, 40C) can include an elemental semiconductor material or a compound semiconductor material. In one embodiment, the semiconductor material of the various single crystalline semiconductor layers (40A, 40B, 40C) can be a III-V compound semiconductor material. The semiconductor material of the various single crystalline semiconductor layers (40A, 40B, 40C) may or may not be doped with p-type dopants and/or n-type dopants. The semiconductor material of the various single crystalline semiconductor layers (40A, 40B, 40C) can be a single crystalline semiconductor material epitaxially aligned to the underlying single crystalline dielectric material of the various single crystalline dielectric material structures (30A, 30B, 30C). The thickness of the various single crystalline semiconductor layers (40A, 40B, 40C) can be from 1 nm to 30 nm, although lesser and greater thicknesses can also be employed. In one embodiment, the semiconductor material of the various single crystalline semiconductor layers (40A, 40B, 40C) can be a single crystalline silicon-containing material, which can be silicon, a silicon-germanium alloy, a silicon-carbon alloy, or a silicon-germanium-carbon alloy. In another embodiment, the semiconductor material of the various single crystalline semiconductor layers (40A, 40B, 40C) can be a III-V compound semiconductor material.

In the first device region R1, a first single crystalline semiconductor material layer 40A is formed directly on sidewall surfaces and a top surface of each single crystalline dielectric material fin 30A. Each first single crystalline semiconductor material layer 40A is in epitaxial alignment with the underlying single crystalline dielectric material fin 30A, and contacts the sidewall surfaces and the top surface of the underlying single crystalline dielectric material fin 30A. For each single crystalline dielectric material fin 30A, the surfaces of a first single crystalline semiconductor material layer 40A and a top surface of the amorphous dielectric layer 20 contact all surfaces of the single crystalline dielectric material fin 30A.

A second single crystalline semiconductor material layer 40B is formed directly on the sidewall surfaces and the top surface of the single crystalline dielectric material portion 30B concurrently with formation of the first single crystalline semiconductor material layers 40A. The second single crystalline semiconductor material layer 40B can be in epitaxial alignment with the single crystalline dielectric material portion 30B, and contacts sidewall surfaces and a top surface of the single crystalline dielectric material portion 30B. The surfaces of the second single crystalline semiconductor material layer 40B and a top surface of the amorphous dielectric layer 20 contact all surfaces of the single crystalline dielectric material portion 30B.

A third single crystalline semiconductor material layer 40C is formed directly on the sidewall surfaces and the top surface of the fin-plate assembly 30C concurrently with formation of the first single crystalline semiconductor material layers 40A. The third single crystalline semiconductor material layer 40C can be in epitaxial alignment with the fin-plate assembly 30C, and contacts sidewall surfaces and a top surface of the fin-plate assembly 30C. The surfaces of the third single crystalline semiconductor material layer 40C and a top surface of the amorphous dielectric layer 20 contact all surfaces of the fin-plate assembly 40C. The third single crystalline semiconductor material layer 40C is a contiguous single crystalline semiconductor material layer.

The selective epitaxy process can provide growth of the single crystalline semiconductor material from the crystalline surfaces of the various single crystalline dielectric material structures (30A, 30B, 30C) while suppressing growth of the semiconductor material on amorphous surfaces. During the selective epitaxy process, one or more deposition processes of a semiconductor material and one or more etch processes of the semiconductor material proceed simultaneously or alternately. The growth rate of the semiconductor material due to the one or more deposition processes on single crystalline surfaces is greater than the deposition rate of the semiconductor material due to the one or more deposition processes on amorphous surfaces. The etch rate of the semiconductor material due to the one or more etch processes set to be greater than the deposition rate of the semiconductor material due to the one or more deposition processes on the amorphous surfaces, and to be lesser than growth rate of the semiconductor material due to the one or more deposition processes on the single crystalline surfaces. Thus, a net deposition of the semiconductor material occurs only on the single crystalline surfaces such as the surfaces of the various single crystalline dielectric material structures (30A, 30B, 30C), and does not occur on the amorphous surface of the amorphous dielectric layer 20.

Referring to FIGS. 8A and 8B, a gate dielectric layer 50L, a first conductive material layer 60L, and a second conductive material layer 70L are sequentially deposited over the various single crystalline semiconductor layers (40A, 40B, 40C) and the amorphous dielectric layers 20. The gate dielectric layer 50L can include any dielectric material known in the art. The first conductive material layer 60L can include any gate conductor material known in the art. The second conductive material layer 70L can also include any gate conductor material known in the art. In a non-limiting illustrative example, the first conductive material layer 60L can include a metallic work function material, and the second conductive material layer 70L can include a doped semiconductor material such as doped polysilicon.

Figure 9C:
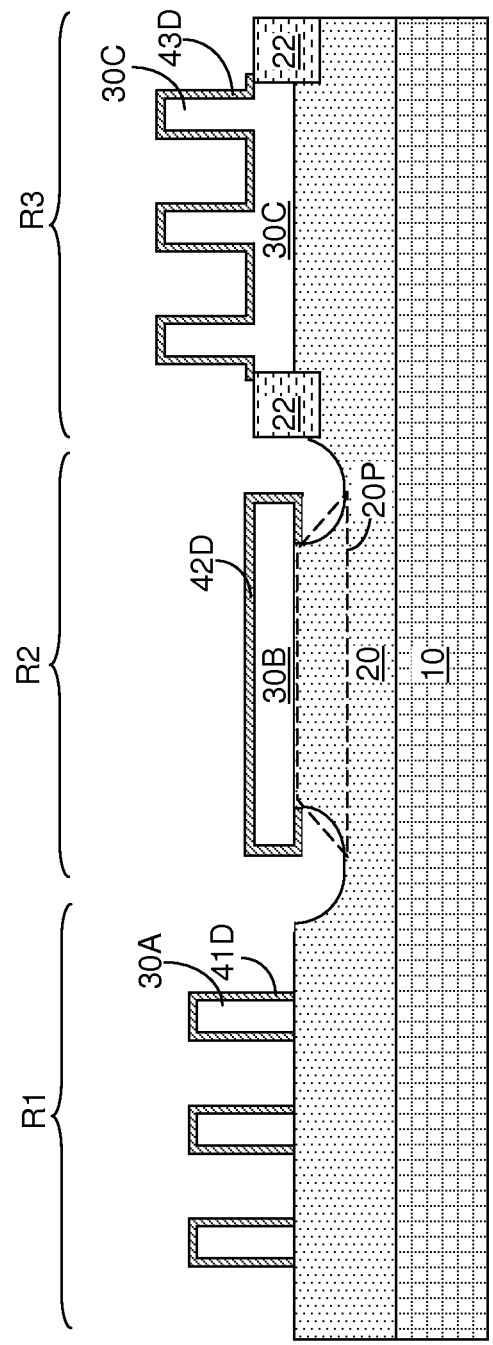
FIG. 9C is a vertical cross-sectional view of the exemplary structure along the vertical plane C-C' of FIG. 9A.

Referring to FIGS. 9A-9C, the gate dielectric layer 50L, the first conductive material layer 60L, and the second conductive material layer 70L can be patterned to form various gate structures. A gate structure including a gate dielectric and a gate electrode can be formed across each of the various single crystalline semiconductor material layers (40A, 40B, 40C; See FIGS. 8A and 8B) in each device region (R1, R2, R3). The various gate structures can include, for example, a first gate structure (50A, 60A, 70A), a second gate structure (50B, 60B, 70B), and a third gate structure (50C, 60C, 70C). The first gate structure (50A, 60A, 70A) includes a first gate dielectric 50A, a first lower gate electrode portion 60A, and a first upper gate electrode portion 70A. The second gate structure (50B, 60B, 70B) includes a second gate dielectric 50B, a second lower gate electrode portion 60B, and a second upper gate electrode portion 70B. The third gate structure (50C, 60C, 70C) includes a third gate dielectric 50C, a third lower gate electrode portion 60C, and a third upper gate electrode portion 70C. Optionally, a first gate spacer 72A, a second gate spacer 72B, and a third gate spacer 72C can be formed around the first gate structure (50A, 60A, 70A), the second gate structure (50B, 60B, 70B), and the third gate structure (50C, 60C, 70C), respectively.

Various portions of the first single crystalline semiconductor material layers 40A can be implanted with p-type dopants or n-type dopants to form first source regions 41S and first drain regions 41D. The first gate structure (50A, 60A, 70A) and optionally, the first gate spacer 72A, can be employed as an implantation mask. Unimplanted portions of the first single crystalline semiconductor material layers 40A (See FIGS. 8A and 8B) constitute first body regions 41B.

Various portions of the second single crystalline semiconductor material layers 40B can be implanted with p-type dopants or n-type dopants to form second source regions 42S and second drain regions 42D. The second gate structure (50B, 60B, 70B) and optionally, the second gate spacer 72B, can be employed as an implantation mask. Unimplanted portions of the second single crystalline semiconductor material layers 40B (See FIGS. 8A and 8B) constitute second body regions 42B.

Various portions of the third single crystalline semiconductor material layers 40C can be implanted with p-type dopants or n-type dopants to form third source regions 43S and third drain regions 43D. The third gate structure (50C, 60C, 70C) and optionally, the third gate spacer 72C, can be employed as an implantation mask. Unimplanted portions of the third single crystalline semiconductor material layers 40C (See FIGS. 8A and 8B) constitute third body regions 43B.

The exemplary structure includes at least an amorphous dielectric layer 20, and a single crystalline dielectric material fin 30A located on a portion of a top surface of the amorphous dielectric layer 20. The exemplary structure further includes a first single crystalline semiconductor material layer (41S, 41D, 41B) in epitaxial alignment with the single crystalline dielectric material fin 30A and contacting sidewall surfaces and a top surface of the single crystalline dielectric material fin 30A. In addition, the exemplary structure includes a first gate structure (50A, 60A, 70A), which includes a first gate dielectric 50A and a first gate electrode (60A,70A) and straddles the first single crystalline semiconductor material layer (41S, 41D, 41B). The single crystalline dielectric material fin 30A can include a single crystalline rare earth oxide material. Surfaces of the single crystalline semiconductor material layer (41S, 41D, 41B) and a top surface of the amorphous dielectric layer 20 can contact all surfaces of the single crystalline dielectric material fin 30A.

The exemplary structure can further include a single crystalline dielectric material portion 30B located on the amorphous dielectric layer 20. The single crystalline dielectric material portion 30B includes at least one single crystalline dielectric nanowire 30W (See FIG. 6A), a first single crystalline dielectric pad 30P1 (See FIG. 6A) adjoined to one end of each of the at least one single crystalline dielectric nanowire 30W, and a second single crystalline dielectric pad 30P2 (See FIG. 6A) adjoined to another end of each of the at least one single crystalline dielectric nanowire 30W.

In addition, the exemplary structure further includes a second single crystalline semiconductor material layer (42S, 42D, 42B) in epitaxial alignment with the single crystalline dielectric material portion 30B and contacting sidewall surfaces and a top surface of the single crystalline dielectric material portion 30B. The exemplar semiconductor structure can further include a second gate structure (50B, 60B, 70B), which can include a second gate dielectric 50B and a second gate electrode (60B, 70B) and straddling the second single crystalline semiconductor material layer (42S, 42D, 42B).

In one embodiment, each of the first and second single crystalline dielectric pads (30P1, 30P2; See FIG. 6A) contacts a portion of the top surface of the amorphous dielectric layer 20 that is coplanar with the portion of the top surface of the amorphous dielectric layer 20 in contact with bottom surfaces of the single crystalline dielectric material fins 30A. The at least one single crystalline dielectric nanowire 30W (See FIG. 6A) can be located above a recessed surface of the amorphous dielectric layer 20. In one embodiment, the bottom surface of each of the at least one single crystalline dielectric nanowire 30W can be coplanar with the bottom surfaces of the single crystalline dielectric material fins 30A.

A pair of pedestal portions 20P of the single crystalline dielectric material layer 20 is in contact with center portions of bottom surfaces of the pair of single crystalline dielectric pads (30P1, 30P2; See FIG. 6A).

The exemplary structure can further include a fin-plate assembly 30C including a same single crystalline dielectric material as the single crystalline dielectric material fins 30A. The fin-plate assembly includes a plate portion 30P (See FIG. 4B) contacting a portion of the top surface of the amorphous dielectric layer 20 and at least one fin portion 30F (See FIG. 4B) protruding from the plate portion 30P and each having a pair of parallel sidewalls. The third single crystalline semiconductor material layer (43S, 43D, 43B) is a contiguous single crystalline semiconductor material layer in epitaxial alignment with the fin-plate assembly 30C and contacting sidewall surfaces and a top surface of each fin portion 30F and a top surface of the plate portion 30P.

In one embodiment, the bottom surface of the plate portion 30P can be coplanar with the portion of the top surface of the amorphous dielectric layer 20 that is in physical contact with the bottom surfaces of the single crystalline dielectric material fins 30A. The fin-plate assembly 30C can include a plurality of fin portions 30F, each of which protrudes from the plate portion 30P, and is laterally spaced from other fin portions 30F. A third gate structure (50C, 60C, 70C) including a third gate dielectric 50C and a third gate electrode (60C, 70C) straddles the third single crystalline semiconductor material layer (43S, 43D, 43B).

While the present disclosure is described employing an embodiment in which three different types of devices are formed in three device regions (R1, R2, R3), each type of device can be manufactured singularly without any other type of devices, or in combination with any other type of devices shown in the present disclosure. Such variations are expressly contemplated herein.

The various field effect transistors of the present disclosure enable manufacture of a thin semiconductor channel on a mechanically stable insulator structure, thereby providing good control of the channel within the body regions. Further, various types of field effect transistors can be manufactured on a same substrate so that a single semiconductor chip can contain field effect transistors having different device characteristics.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   an amorphous dielectric layer;
   a single crystalline dielectric material fin located on a portion of a top surface of said amorphous dielectric layer;
   a single crystalline semiconductor material layer in epitaxial alignment with said single crystalline dielectric material fin and contacting sidewall surfaces and a top surface of said single crystalline dielectric material fin; and
   a gate structure including a gate dielectric and a gate electrode and straddling over said single crystalline semiconductor material layer.

2. The semiconductor structure of claim 1, wherein said single crystalline dielectric material fin comprises a single crystalline rare earth oxide material.

3. The semiconductor structure of claim 1, wherein surfaces of said single crystalline semiconductor material layer and a top surface of said amorphous dielectric layer contact all surfaces of said single crystalline dielectric material fin.

4. The semiconductor structure of claim 1, further comprising a single crystalline dielectric material portion located on said amorphous dielectric layer and comprising:
   at least one single crystalline dielectric nanowire;
   a first single crystalline dielectric pad adjoined to one end of each of said at least one single crystalline dielectric nanowire; and
   a second single crystalline dielectric pad adjoined to another end of each of said at least one single crystalline dielectric nanowire.

5. The semiconductor structure of claim 4, further comprising another single crystalline semiconductor material layer in epitaxial alignment with said single crystalline dielectric material portion and contacting sidewall surfaces and a top surface of said single crystalline dielectric material portion.

6. The semiconductor structure of claim 5, further comprising another gate structure including another gate dielectric and another gate electrode and straddling said another single crystalline semiconductor material layer.

7. The semiconductor structure of claim 4, wherein said first and second single crystalline dielectric pads contact another portion of said top surface of said amorphous dielectric layer that is coplanar with said portion of said top surface of said amorphous dielectric layer, and said at least one single crystalline dielectric nanowire is located above a recessed surface of said amorphous dielectric layer.

8. The semiconductor structure of claim 4, wherein a bottom surface of said at least one single crystalline dielectric nanowire is coplanar with a bottom surface of said single crystalline dielectric material fin.

9. The semiconductor structure of claim 1, further comprising:
   a fin-plate assembly comprising a same single crystalline dielectric material as said single crystalline dielectric material fin, said fin-plate assembly including a plate portion contacting another portion of said top surface of said amorphous dielectric layer and said fin portion protruding from said plate portion and having a pair of parallel sidewalls; and
   a contiguous single crystalline semiconductor material layer in epitaxial alignment with said fin-plate assembly and contacting sidewall surfaces and a top surface of said fin portion and a top surface of said plate portion.

10. The semiconductor structure of claim 9, wherein a bottom surface of said plate portion is coplanar with said portion of said top surface of said amorphous dielectric layer.

11. The semiconductor structure of claim 9, wherein said fin-plate assembly further comprises another fin portion protruding from said plate portion and laterally spaced from said fin portion.

12. The semiconductor structure of claim 9, further comprising another gate structure including another gate dielectric and another gate electrode and straddling over said contiguous single crystalline semiconductor material layer.

13. A method of forming a semiconductor structure comprising:
   providing a substrate including at least a vertical stack of an amorphous dielectric layer and a single crystalline dielectric material layer;
   patterning said single crystalline dielectric material layer to form at least a single crystalline dielectric material fin;
   forming a single crystalline semiconductor material layer directly on sidewall surfaces and a top surface of said single crystalline dielectric material fin by selective epitaxy of a semiconductor material; and forming a gate structure including a gate dielectric and a gate electrode across said single crystalline semiconductor material layer.

14. The method of claim 13, wherein said single crystalline dielectric material fin comprises a single crystalline rare earth oxide material.

15. The method of claim 13, further comprising:
forming a single crystalline dielectric material portion including at least one single crystalline dielectric nanowire by said patterning of said single crystalline dielectric material layer; and
recessing a portion of a top surface of said amorphous dielectric layer from underneath said at least one single crystalline dielectric nanowire employing an isotropic etch process, whereby said at least one single crystalline dielectric nanowire becomes suspended over a recessed surface of said amorphous dielectric layer.

16. The method of claim 15, further comprising forming another single crystalline semiconductor material layer directly on sidewall surfaces and a top surface of said single crystalline dielectric material portion concurrently with formation of said single crystalline semiconductor material layer.

17. The method of claim 15, wherein said single crystalline dielectric material portion further comprises a pair of single crystalline dielectric pads adjoined to each of said at least one single crystalline dielectric nanowire, and a pair of pedestal portions of said single crystalline dielectric material layer is in contact with center portions of bottom surfaces of said pair of single crystalline dielectric pads after said isotropic etch process.

18. The method of claim 13, further comprising forming a fin-plate assembly comprising a same single crystalline dielectric material as said single crystalline dielectric material fin, said fin-plate assembly including a plate portion contacting another portion of said top surface of said amorphous dielectric layer and said fin portion protruding from said plate portion and having a pair of parallel sidewalls by said patterning of said single crystalline dielectric material layer.

19. The method of claim 18, further comprising forming a contiguous single crystalline semiconductor material layer directly on sidewall surfaces and a top surface of said fin portion and a top surface of said plate portion concurrently with formation of said single crystalline semiconductor material layer.

20. The method of claim 18, further comprising:
thinning a region of said single crystalline dielectric material layer, while masking another region of said single crystalline dielectric material layer; and
concurrently patterning said single crystalline dielectric layer in said region and said another region, wherein a remaining portion of said single crystalline dielectric layer in said thinned region comprises said single crystalline dielectric material fin and a remaining portion of said single crystalline dielectric layer in said masked region comprises said fin-plate assembly.

\* \* \* \* \*